(12) United States Patent
Aoba et al.

(10) Patent No.: US 9,041,565 B2
(45) Date of Patent: May 26, 2015

(54) NRZ SIGNAL AMPLIFYING DEVICE AND METHOD, AND ERROR RATE MEASUREMENT DEVICE AND METHOD

(71) Applicant: ANRITSU CORPORATION, Kanagawa (JP)

(72) Inventors: Wataru Aoba, Kanagawa (JP); Kazuhiro Fujinuma, Kanagawa (JP); Takeshi Wada, Kanagawa (JP)

(73) Assignee: ANRITSU CORPORATION, Kanagawa (JP)

( * ) Notice: Subject to any disclaimer, the term of this patent is extended or adjusted under 35 U.S.C. 154(b) by 0 days.

(21) Appl. No.: 14/314,840

(22) Filed: Jun. 25, 2014

(65) Prior Publication Data

US 2015/0067416 A1 Mar. 5, 2015

(30) Foreign Application Priority Data

Sep. 3, 2013 (JP) .................................. 2013-182369

(51) Int. Cl.
*H03M 5/06* (2006.01)
*H03F 3/68* (2006.01)
*G06F 11/34* (2006.01)

(52) U.S. Cl.
CPC ...... *H03F 3/68* (2013.01); *G06F 11/34* (2013.01); *H03F 2200/375* (2013.01)

(58) Field of Classification Search
CPC .............. H03M 5/145; G11B 20/1426; G11B 20/10009
USPC ...................................... 341/68–69, 118, 155
See application file for complete search history.

(56) References Cited

U.S. PATENT DOCUMENTS 6,737,995 B2 * 5/2004 Ng et al. .......................... 341/68
7,973,681 B2 * 7/2011 Garg et al. ....................... 341/69

FOREIGN PATENT DOCUMENTS

JP 2007-274474 10/2007
JP 2010-028661 2/2010

* cited by examiner

*Primary Examiner* — Khai M Nguyen
(74) *Attorney, Agent, or Firm* — Pearne & Gordon LLP

(57) ABSTRACT

To set an optimum offset voltage and detect an NRZ signal with a very small amplitude. An NRZ signal amplifying device 2 includes: input-side voltage detection means 13 for detecting a high-level voltage and a low-level voltage of an input signal to the main amplifier 12; output-side voltage detection means 14 for detecting the two signals inverted relative to each other; and offset voltage control means 15 for calculating a center voltage between the detected high-level voltage and low-level voltage, setting an offset voltage at which the center voltage is the center of an appropriate input range of the main amplifier 12 to the offset circuit 11, and finely adjusting the offset voltage, such that a voltage difference between the detected two signals inverted relative to each other and a polarity change point is close to 0.

12 Claims, 7 Drawing Sheets

NRZ SIGNAL AMPLIFYING DEVICE AND METHOD, AND ERROR RATE MEASUREMENT DEVICE AND METHOD

TECHNICAL FIELD

The present invention relates to an NRZ signal amplifying device and method which inputs a test signal with a predetermined pattern to a device under test including various electronic components, such as an optical converter, as an object to be measured and amplifies an NRZ signal with a very small amplitude (for example, 10 mVp-p to 25 mVp-p) as a signal to be amplified which is transmitted from the object to be measured in response to the input of the test signal and an error rate measurement device and method which measures the bit error rate of the signal to be amplified using the NRZ signal amplifying device and method.

BACKGROUND ART

In recent years, various types of digital wired communication devices have required capability to transmit a large amount of data, with an increase in the number of users or the spreading of multimedia communication. A bit error rate which is defined as the comparison between the number of data items in which a code error occurs among the received data items and the total number of received data items has been known as one of the indexes for evaluating the quality of a digital signal in the digital wired communication device.

For example, the following Patent Document 1 discloses an error rate measurement device as a measurement device for measuring the bit error rate.

The error rate measurement device transmits a test signal including fixed data to the object to be measured, which is a device under test that includes various electronic components, such as an optical converter, compares a reference signal and the signal to be amplified, which is transmitted from the object to be measured in response to the input of the test signal, bit by bit, and measures the error rate of the signal to be amplified. FIG. 6 is a diagram illustrating the schematic structure of the error rate measurement device disclosed in the following Patent Document 1.

An error rate measurement device 101 shown in FIG. 6 includes a data storage unit 101a which is formed by a memory, such as a RAM, a comparative data storage unit 101b, a positional information storage unit 101c, a signal transmitting unit 101d which is formed by, for example, an integrated circuit, a signal receiving unit 101e, a synchronous detection unit 101f, a comparison unit 101g, a display control unit 101h, a display device 101i, such as a CRT display or a liquid crystal display, and an operation unit 101j such as a keyboard. The error rate measurement device 101 compares input data which is received from an object 102 to be measured with the known data to be received from the object 102 to be measured, sequentially stores bit strings of comparative data including one bit or a plurality of bits which are detected under a predetermined detection condition in a plurality of blocks in order of detection, and displays each bit string which is obtained from the comparative data stored in each of the plurality of blocks on the display device 101i so as to be arranged on the basis of the position satisfying a predetermined arrangement condition.

However, when the error rate measurement device 101 measures the error rate of a non-return-to-zero (NRZ) signal used in data communication as the signal to be amplified, an NRZ signal amplifying device which amplifies the NRZ signal to a desired level is used.

FIG. 7 is a block diagram illustrating the structure of the NRZ signal amplifying device disclosed in the following Patent Document 2. An NRZ signal amplifying device 201 shown in FIG. 7 has an automatic adjustment function which constantly operates a loop for detecting the center voltage of an input voltage to a main amplifier 203 and for setting an offset voltage applied to an offset circuit 202 to constantly automatically adjust the offset voltage suitable for the center voltage of the input voltage.

Furthermore, the NRZ signal amplifying device 201 includes: an offset circuit 202 that applies the offset voltage to an NRZ signal which is input as the signal to be amplified and outputs the signal; a main amplifier 203 that receives an output signal from the offset circuit 202 and amplifies the output signal; voltage detection means 204 for detecting a high-level voltage and a low-level voltage of an input signal to the main amplifier 203; A/D converters 205 (205a and 205b) that convert the high-level voltage and the low-level voltage detected by the voltage detection means 204 into digital values; center voltage calculation means 206 for calculating a center voltage between the high-level voltage and the low-level voltage on the basis of the digital values converted by the A/D converters 205; and offset voltage setting means 207 for calculating an offset voltage at which the center voltage calculated by the center voltage calculation means 206 is substantially the center of the appropriate input range of the main amplifier 203 and gives the offset voltage to the offset circuit 202.

The voltage detection means 204 includes: a first comparator 204a that compares an input signal Sa to the main amplifier 203 with a first reference voltage Vs1; a second comparator 204b that compares the input signal Sa to the main amplifier 203 with a second reference voltage Vs2; a first filter 204c that extracts a DC component from an output signal C1 from the first comparator 204a; a second filter 204d that extracts a DC component from an output signal C2 from the second comparator 204b; a first operational amplifier 204e that receives an output signal DC1 from the first filter 204c and a first standard voltage Vr1 equal to an output upper limit voltage from the first comparator 204a and gives a difference output therebetween as a first reference voltage Vs1 to the first comparator 204a; and a second operational amplifier 204f that receives an output signal DC2 from the second filter 204d and a second standard voltage Vr2 equal to an output upper limit voltage from the second comparator 204b and gives a difference output therebetween as a second reference voltage Vs2 to the second comparator 204b. The voltage detection means 204 performs feedback control such that the first reference voltage Vs1 and the second reference voltage Vs2 are equal to the high-level voltage and the low-level voltage of the signal Sa input to the main amplifier 203, respectively, and gives the first and second reference voltages Vs1 and Vs2 as the high-level voltage and the low-level voltage to the center voltage calculation means 206.

As such, the NRZ signal amplifying device 201 performs feedback control such that the first reference voltage Vs1 is substantially equal to the low-level voltage of the signal S1 input to the main amplifier 203 and the second reference voltage Vs2 is substantially equal to the high-level voltage of the signal S1. That is, the first and second reference voltages Vs1 and Vs2 are given as the high-level voltage and the low-level voltage to the center voltage calculation means 206. Therefore, the center voltage Vcent of the NRZ signal S can be equal to the center voltage Vaa of the appropriate input range of the main amplifier 203.

RELATED ART DOCUMENT

Patent Document

[Patent Document 1] Japanese Unexamined Patent Application Publication No. 2007-274474
[Patent Document 2] Japanese Unexamined Patent Application Publication No. 2010-028661

DISCLOSURE OF THE INVENTION

Problem That the Invention is to Solve

However, when the NRZ signal amplifying device 201 is used in the error rate measurement device 101 and the error rate of the NRZ signal with, particularly, a very small amplitude (for example, 10 mVp-p to 25 mVp-p) as the signal to be amplified is measured, a device with a wide band and a high gain needs to be used as the main amplifier 203 to improve an input sensitivity performance, the main amplifier 203 needs to amplify the signal Sa to a level that is sufficiently higher than the input sensitivity of a demultiplexer (DEMUX) provided in the rear stage of the main amplifier 203, and an offset voltage needs to be set such that an input amplitude to the demultiplexer is the maximum.

However, when the automatic adjustment function of the NRZ signal amplifying device 201 according to the related art is used, an error of a few millivolts occurs in the detection of the input signal, the calculation of the center voltage, and the setting of the offset voltage and thus a total error of about 10 mV occurs. In addition, the output from the A/D converter 205 is changed with a change in temperature and this change in the output is one of the causes of the error. Therefore, when the NRZ signal with a very small amplitude is measured, it is difficult for the NRZ signal amplifying device 201 according to the related art to set the optimum offset voltage using the automatic adjustment function and an error occurs in the measurement result, which makes it difficult to measure an accurate error rate. In addition, it is necessary to reduce the set error to about 2 mV in order to set the optimum offset voltage such that the NRZ signal with a very small amplitude can be detected by the automatic adjustment function of the NRZ signal amplifying device 201 according to the related art, with the assumption of a reduction in the operating time or the use of a measurement device in the manufacturing line.

The invention has been made in view of the above-mentioned problems and an object of the invention is to provide an NRZ signal amplifying device and method and an error rate measurement device and method which can set an optimum offset voltage and measure an accurate error rate even when an NRZ signal with a very small amplitude is measured.

Means for Solving the Problem

In order to achieve the object of the invention, according to a first aspect of the invention, an NRZ signal amplifying device includes: an offset circuit 11 that applies an offset voltage to an NRZ signal which is input as a signal to be amplified and outputs the signal; a main amplifier 12 that receives the output signal from the offset circuit, amplifies the output signal, and outputs the amplified signal as two signals which are inverted relative to each other; input-side voltage detection means 13 for detecting a high-level voltage and a low-level voltage of an input signal to the main amplifier; output-side voltage detection means 14 for detecting the voltages of the two signals inverted relative to each other which are output from the main amplifier; and offset voltage control means 15 for calculating a center voltage between the high-level voltage and the low-level voltage detected by the input-side voltage detection means, calculating an offset voltage at which the calculated center voltage is the center of an appropriate input range of the main amplifier, setting the offset voltage to the offset circuit, and finely adjusting the offset voltage, such that a voltage difference between the two signals inverted relative to each other which are output from the main amplifier and are detected by the output-side voltage detection means is close to 0.

According to a second aspect of the invention, in the NRZ signal amplifying device according to the first aspect, the output-side voltage detection means 14 may include two A/D converters 14c and 14f that convert the two signals inverted relative to each other into digital values. The offset voltage control means 15 may include: comparison and determination means 15b for comparing the digital values from the two A/D converters, calculating a voltage difference, and determines which of voltage differences of two points where the polarity of the calculated voltage difference is changed is closer to 0; offset voltage calculation means 15c for calculating an offset adjustment voltage for finely adjusting the offset voltage, on the basis of the voltage difference, which is closer to 0, of the voltage differences of the two points where the polarity of the voltage difference is changed; and offset voltage setting means 15d for setting the offset adjustment voltage calculated by the offset voltage calculation means and finely adjusting the offset voltage.

According to a third aspect of the invention, in the NRZ signal amplifying device according to the first aspect, the offset voltage control means 15 may include: a comparison circuit 15e that compares the two signals which are inverted relative to each other and outputs a voltage difference between the two signals as an offset adjustment voltage; and a switching circuit 15f that selectively switches a first loop A for setting the offset voltage to the offset circuit 11 and a second loop B for finely adjusting the offset voltage using the offset adjustment voltage from the comparison circuit.

According to a fourth aspect of the invention, an NRZ signal amplifying method includes: a step of applying an offset voltage from an offset circuit 11 to an NRZ signal which is input as a signal to be amplified and outputting the signal; a step of receiving the output signal from the offset circuit, amplifying the output signal using a main amplifier 12, and outputting the amplified signal as two signals which are inverted relative to each other; a step of detecting a high-level voltage and a low-level voltage of an input signal to the main amplifier; a step of detecting the voltages of the two signals inverted relative to each other which are output from the main amplifier; and a step of calculating a center voltage between the detected high-level voltage and low-level voltage, calculating an offset voltage at which the calculated center voltage is the center of an appropriate input range of the main amplifier, setting the offset voltage to the offset circuit, and finely adjusting the offset voltage, such that a voltage difference between the detected two signals inverted relative to each other which are output from the main amplifier is close to 0.

According to a fifth aspect of the invention, the NRZ signal amplifying method according to the fourth aspect may further include: a step of converting the two signals inverted relative to each other into digital values; a step of comparing the digital values of the two signals, calculating a voltage difference, and determining which of voltage differences of two points where the polarity of the calculated voltage difference is changed is closer to 0; a step of calculating an offset adjustment voltage for finely adjusting the offset voltage, on the basis of the voltage difference, which is closer to 0, of the voltage differences of the two points where the polarity of the voltage difference is changed; and a step of setting the offset adjustment voltage and finely adjusting the offset voltage.

According to a sixth aspect of the invention, the NRZ signal amplifying method according to the fourth aspect may further include: a step of comparing the two signals which are inverted relative to each other and outputting a voltage difference between the two signals as an offset adjustment voltage; and a step of selectively switching a first loop A for setting the offset voltage to the offset circuit 11 and a second loop B for finely adjusting the offset voltage using the offset adjustment voltage.

According to a seventh aspect of the invention, an error rate measurement device includes the NRZ signal amplifying device according to any one of the first to third aspects; and an error rate measurement unit 6 that compares a reference signal and a data signal output from the main amplifier 12 bit by bit and measures an error rate of the data signal.

According to an eighth aspect of the invention, there is provided an error rate measurement method using the NRZ signal amplifying method according to any one of the fourth to sixth aspects. The error rate measurement method includes a step of comparing a reference signal and a data signal output from the main amplifier 12 bit by bit and measuring an error rate of the data signal.

Advantage of the Invention

According to the invention, even when an NRZ signal with a very small amplitude is measured, it is possible to set an optimum offset voltage using the existing automatic adjustment function.

According to the third and sixth aspects of the invention, the offset voltage applied to the offset circuit can be finely adjusted by an analog circuit. It is possible to detect an NRZ signal with a very small amplitude at a high speed and to set the optimum offset voltage.

According to the seventh and eighth aspects of the invention, even when an NRZ signal with a very small amplitude is measured, the optimum offset voltage is applied to the offset circuit and it is possible to measure an accurate error rate.

BEST MODE FOR CARRYING OUT THE INVENTION

Hereinafter, embodiments of the invention will be described in detail with reference to FIGS. 1 to 4 of the drawings.

An error rate measurement device including an NRZ signal amplifying device according to the invention uses a device (amplifier) with a wide band and a high gain to improve the accuracy of the automatic adjustment function of an NRZ signal amplifying device 201 (see FIG. 7) according to the related art which is disclosed in Patent Document 2, while improving an input sensitivity performance, thereby improving an input automatic detection and adjustment function.

Figure 1:
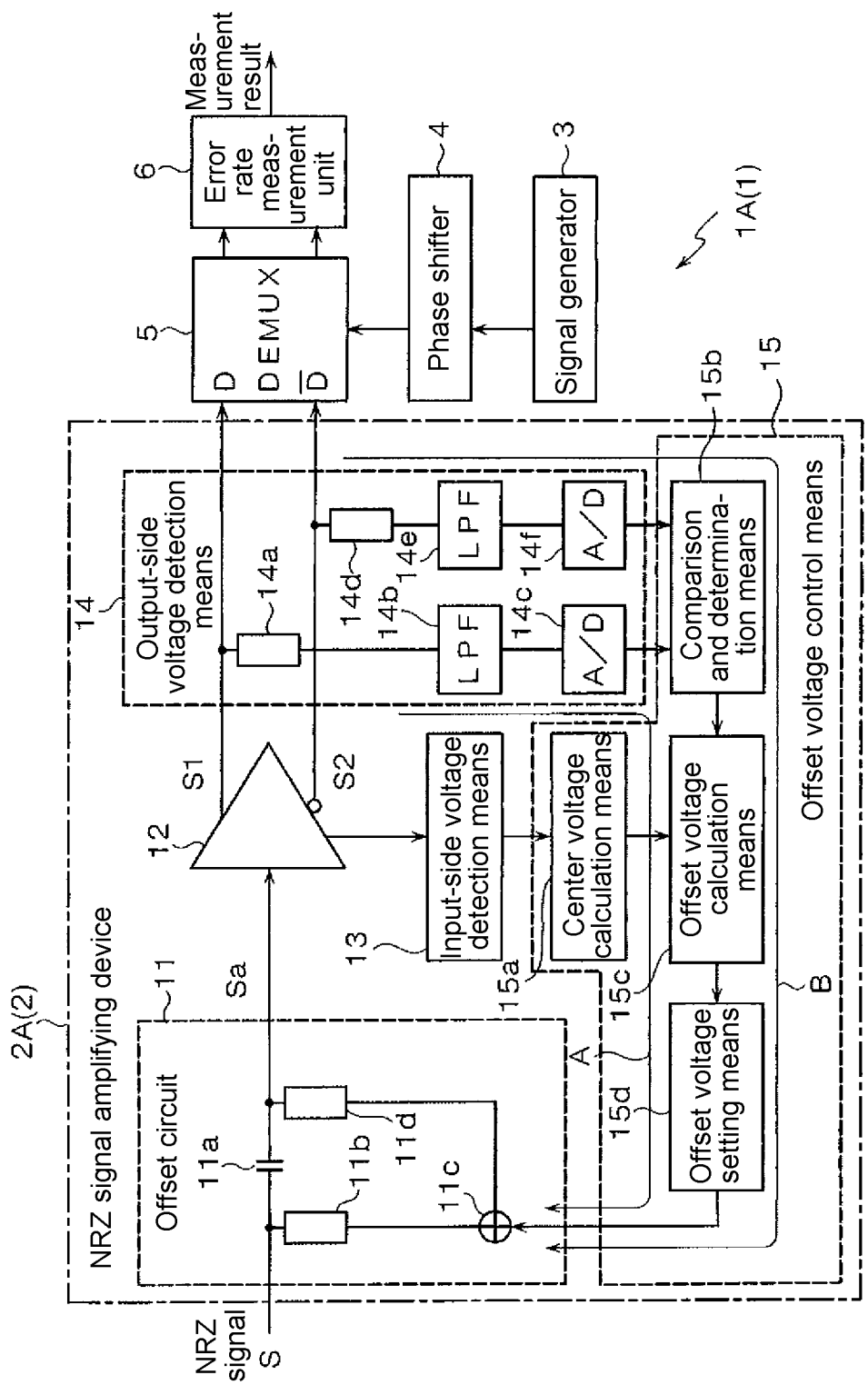
FIG. 1 is a block diagram illustrating a first embodiment of an NRZ signal amplifying device included in an error rate measurement device according to the invention.
Figure 2:
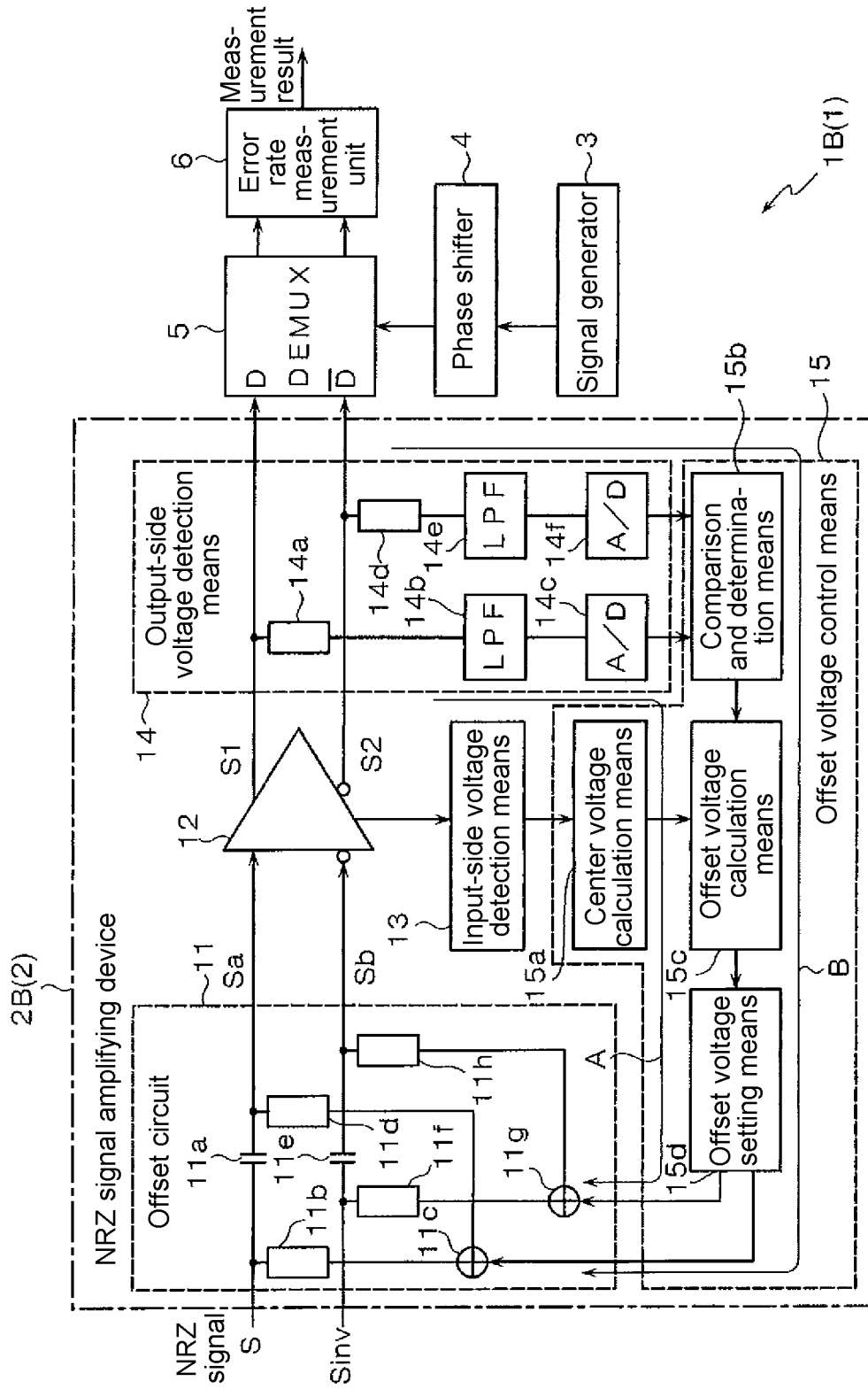
FIG. 2 is a block diagram illustrating a second embodiment of the NRZ signal amplifying device included in the error rate measurement device according to the invention.
Figure 3:
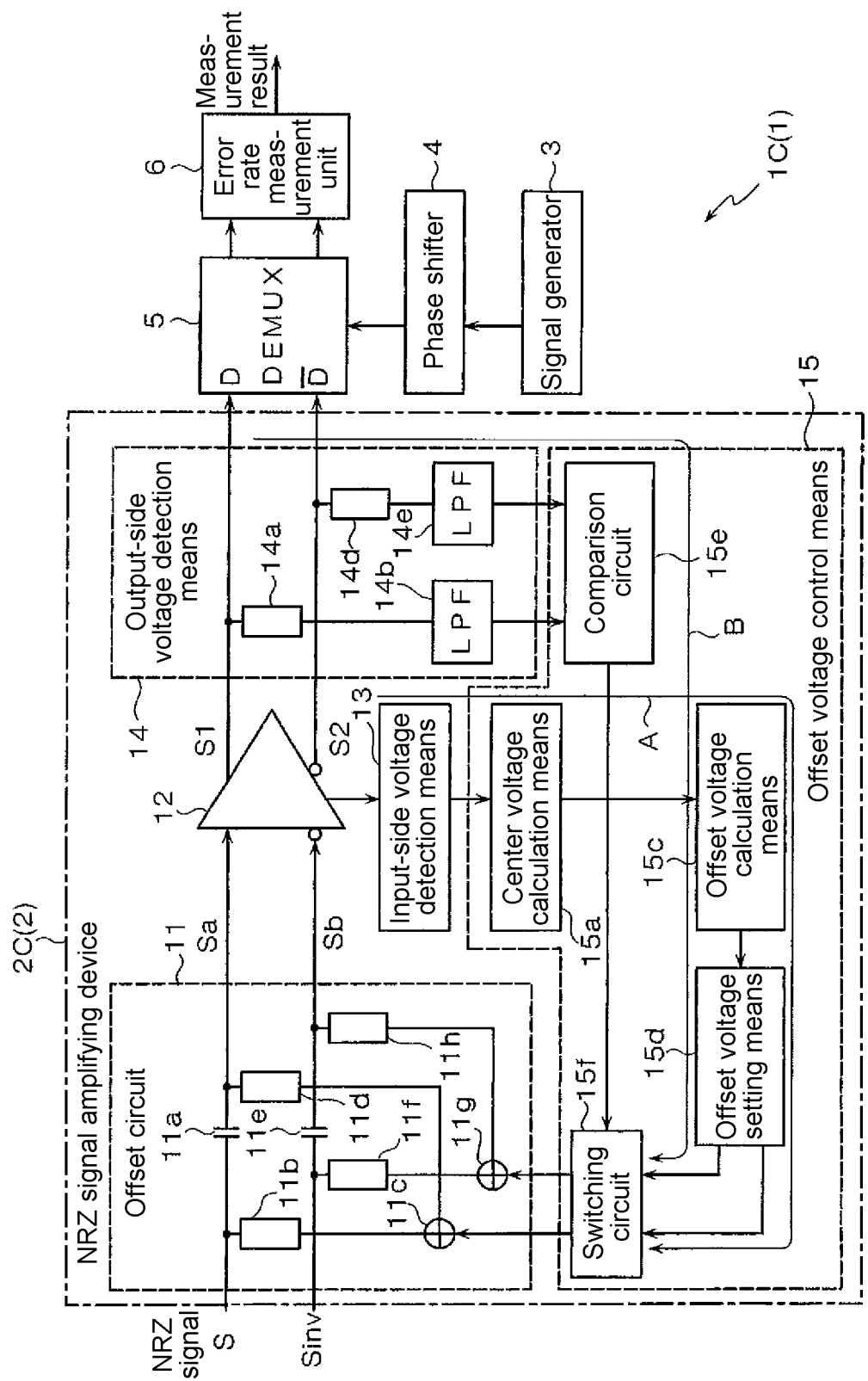
FIG. 3 is a block diagram illustrating a third embodiment of the NRZ signal amplifying device included in the error rate measurement device according to the invention.

Each of error rate measurement devices 1 (1A, 1B, and 1C) shown in FIGS. 1 to 3 has a schematic structure in which each device includes an NRZ signal amplifying device 2 (2A, 2B, or 2C), a signal generator 3, a phase shifter 4, a demultiplexer (DEMUX) 5, and an error rate measurement unit 6.

First, the structure of each embodiment of the NRZ signal amplifying device 2, which is a main portion of the invention, will be described.

First Embodiment

As shown in FIG. 1, the NRZ signal amplifying device 2A according to a first embodiment includes an offset circuit 11, a main amplifier 12, input-side voltage detection means 13, output-side voltage detection means 14, and offset voltage control means 15.

The offset circuit 11 is connected to the front stage of the main amplifier 12 and includes a capacitor 11a that transmits an AC component of an NRZ signal S which is input as a signal to be amplified, a coil (including a resistor) 11b that transmits a DC component, an adder 11c that adds an offset voltage to the DC component which passes through the coil 11b, and a coil (including a resistor) 11d that transmits an output from the adder 11c so as to be combined with the AC component transmitted through the capacitor 11a.

The offset circuit 11 adds a desired DC voltage to the input NRZ signal S and variably controls an offset voltage using the automatic adjustment function. Therefore, the signal Sa which is input from the offset circuit 11 to the main amplifier 12 is maintained in the appropriate input range of the main amplifier 12.

The automatic adjustment function constantly operates a loop for detecting the center voltage of an input voltage to the main amplifier 12 and for setting the offset voltage (an arrow A in FIG. 1) to constantly set the offset voltage suitable for the center voltage of the input voltage to the offset circuit 11.

The detailed structure and operation of the automatic adjustment function are the same as those in Patent Document 2 (JP-A-2010-028661) (see paragraphs [0030] to [0047]).

The main amplifier 12 amplifies the signal Sa input from the offset circuit 11 to a level that is sufficiently higher than the input sensitivity of the demultiplexer (DEMUX) 5 and outputs two signals S1 and S2 which are inverted relative to each other, in order to respond to error rate measurement in which an NRZ signal with a very small amplitude (for example, 10 mVp-p to 25 mVp-p) is used as the signal to be amplified.

The input-side voltage detection means 13 detects the high-level voltage and low-level voltage of the signal Sa input to the main amplifier 12, converts the detected high-level voltage and low-level voltage into digital values using an A/D converter (not shown), and outputs the converted digital values to the center voltage calculation means 15a which will be described below.

The output-side voltage detection means 14 includes a coil (including a resistor) 14a that transmits a DC component of a signal S1 output from a non-inverting output terminal of the main amplifier 12, a low-pass filter (LPF) 14b that transmits a component with a frequency lower than a cutoff frequency in the signal transmitted through the coil 14a, an A/D converter (A/D) 14c that converts the signal transmitted through the low-pass filter 14b into a digital value, a coil (including a resistor) 14d that transmits a DC component of a signal S2 output from an inverting output terminal of the main amplifier 12, a low-pass filter (LPF) 14e that transmits a component with a frequency lower than the cutoff frequency in the signal transmitted through the coil 14d, and an A/D converter (A/D) 14f that converts the signal transmitted through the low-pass filter 14e into a digital value.

The offset voltage control means 15 includes center voltage calculation means 15a, comparison and determination means 15b, offset voltage calculation means 15c, and offset voltage setting means 15d.

The center voltage calculation means 15a calculates a center voltage between the high-level voltage and the low-level voltage detected by the input-side voltage detection means 13 on the basis of the digital value input from the input-side voltage detection means 13.

The comparison and determination means 15b compares a digital value A/D1 input from the A/D converter 14c and a digital value A/D2 input from the A/D converter 14f and calculates A/D1−A/D2 (or A/D2−A/D1) as a voltage difference therebetween.

The input detection and setting error of the main amplifier 12 include artificial adjustment and it is difficult to adjust the error to zero in the actual operation. In order to determine whether the output from the main amplifier 12 is optimal, the comparison and determination means 15b calculates two points where the polarity of A/D1−A/D2 is changed, determines which of the calculation results of the two points is closer to 0, and outputs the calculation result closer to 0 to the offset voltage calculation means 15c.

The offset voltage calculation means 15c calculates an offset voltage at which the center voltage calculated by the center voltage calculation means 15a is substantially the center of the appropriate input range of the main amplifier 12. In addition, the offset voltage calculation means 15c calculates an offset adjustment voltage for finely adjusting the offset voltage on the basis of the calculation result (the value of A/D1−A/D2 close to 0) input from the comparison and determination means 15b.

The offset voltage setting means 15d sets the offset voltage calculated by the offset voltage calculation means 15c to the offset circuit 11. In addition, after setting the offset voltage, the offset voltage setting means 15d finely adjusts the offset voltage using the offset adjustment voltage calculated by the offset voltage calculation means 15c such that the value of A/D1−A/D2 is close to 0.

Figure 4:
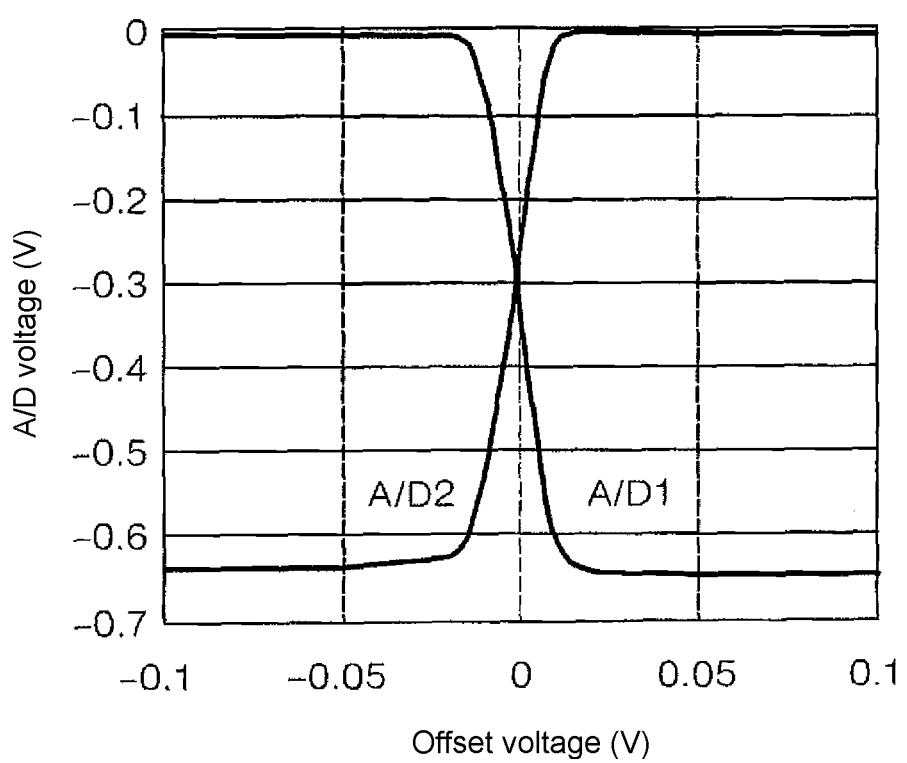
FIG. 4 is a diagram illustrating the measured value of input-output static characteristics of a main amplifier in the NRZ signal amplifying device shown in FIGS. 1 and 2.

FIG. 4 shows the relationship between the offset voltage and the output voltage from the amplifier (the DC voltage of A/D1 and A/D2) (the In-Out static characteristics of the amplifier and the measured value).

In general, the main amplifier 12 has the static characteristics shown in FIG. 4. Therefore, the gain of the signal is the maximum at the point where A/D1 is equal to A/D2 (−0.3 V in the example shown in FIG. 4) and it is possible to transmit the signal to the circuit in the next stage with high efficiency. An offset voltage fine adjustment function is performed by a loop (an arrow B in FIG. 1) for determining the set state of the offset voltage from the values (A/D1 and A/D2) monitored by the A/D converters 14c and 14f and performing A/D detection and determination on the output side of the main amplifier 12 and the fine adjustment of the offset voltage such that the value of A/D1−A/D2 is close to 0.

That is, in the NRZ signal amplifying device 2 according to this embodiment, first, the existing automatic adjustment function is performed by the loop (the arrow A in FIG. 1) for detecting the center voltage of the input voltage to the main amplifier 12 and setting the offset voltage. Then, the offset voltage fine adjustment function is performed by the loop for performing A/D detection and determination on the output side of the main amplifier 12 and finely adjusting the offset voltage (the arrow B in FIG. 1) and the offset voltage added to the offset circuit 11 is finely adjusted such that the value of A/D1−A/D2 is close to 0. In this way, the setting of the offset voltage is optimized.

In the loop for performing A/D detection and determination and finely adjusting the offset voltage (the arrow B in FIG. 1), it is possible to transmit the signal to the circuit in the next stage with high efficiency when the offset voltage at which the difference between the digital value A/D1 of the A/D converter 14c and the digital value A/D2 of the A/D converter 14f is 0 is set. However, in the actual setting of the offset voltage, it is difficult to set the offset voltage to exactly 0 V since the resolution is at a minimum (in this embodiment, 0.5 mV). The comparison and determination means 15b determines which of two points where the polarity of the value of A/D1−A/D2 is changed is closer to 0. The offset voltage calculation means 15c calculates the offset adjustment voltage on the basis of the value of A/D1−A/D2 which is determined to be close to 0. The offset voltage is finely adjusted on the basis of the calculated offset adjustment voltage. In this way, the optimum value of the offset voltage is determined.

Specifically, when the offset voltage set by the existing automatic adjustment function is applied to the offset circuit 11, +0.5 mV or −0.5 mV, as an example, is applied to the offset circuit 11 depending on the polarity of A/D1−A/D2 and the offset voltage fine adjustment function by the loop for (the arrow B in FIG. 1) performing A/D detection and determination and finely adjusting the offset voltage is stopped at the time the polarity of A/D1−A/D2 is changed.

According to the NRZ signal amplifying device 2 of this embodiment, the performance can be achieved only by the operation of the output-side voltage detection means 14 and the comparison and determination means 15b determining the output of the main amplifier 12. In addition, the NRZ signal amplifying device 2 adopts the structure of the NRZ signal amplifying device 201 disclosed in Patent Document 2 without any change and uses a function of monitoring the center voltage of the input signal.

Second Embodiment

Next, a second embodiment of the error rate measurement device including the NRZ signal amplifying device according to the invention will be described with reference to FIG. 2. In the second embodiment, the same components as those in the first embodiment shown in FIG. 1 are denoted by the same reference numerals and the description thereof will not be repeated.

In an NRZ signal amplifying device 2B according to the second embodiment shown in FIG. 2, two NRZ signals S and Sinv which are inserted relative to each other are used as the signals to be amplified. The NRZ signal S is input to a non-inverting input terminal of a differential main amplifier 12 through an offset circuit 11, is amplified at a predetermined gain, and is output as a data signal S1 from a non-inverting output terminal. The NRZ signal Sinv is input to an inverting input terminal of the differential main amplifier 12 through the offset circuit 11, is amplified at a predetermined gain, and is output as a data signal S2 from an inverting output terminal.

The other structures and operations are the same as those in the NRZ signal amplifying device 1A according to the first embodiment shown in FIG. 1.

Third Embodiment

Next, a third embodiment of the error rate measurement device including the NRZ signal amplifying device according to the invention will be described with reference to FIG. 3. In the third embodiment, the same components as those in the first embodiment shown in FIG. 1 or the second embodiment shown in FIG. 2 are denoted by the same reference numerals and the description thereof will not be repeated.

In the NRZ signal amplifying devices 1A and 1B according to the first and second embodiments, the comparison and determination means 15b and the offset voltage calculation means 15c are formed by a field-programmable gate array (FPGA) in order to reduce a circuit space related to a determination process and a sequence.

However, the FPGA can perform processing at a high speed, but requires a lot of time for a determination process. In the NRZ signal amplifying device 1C according to the third embodiment shown in FIG. 3, in order to particularly detect a change in the NRZ signal with a very small amplitude, a comparison circuit 15e, which is an analog circuit such as a comparator or a subtraction circuit, is connected to the next stage of low-pass filters (LPFs) 14b and 14e and a switching circuit 15f, such as a switch, selectively switches a function between an automatic adjustment function (a loop represented by an arrow A in FIG. 4) and an offset voltage fine adjustment function (a loop represented by an arrow B in FIG. 4).

In the NRZ signal amplifying device 1C according to the third embodiment, 2-phase NRZ signals S and Sinv which are inverted relative to each other are input to the main amplifier 12 through the offset circuit 11 and the main amplifier 12 outputs the signals S1 and S2 which are inverted relative to each other. However, similarly to FIG. 1, a single-phase NRZ signal S may be input to the main amplifier 12 through the offset circuit 11 and the main amplifier 12 may output the signals S1 and S2 which are inverted relative to each other.

Next, the signal generator 3, the phase shifter 4, the demultiplexer 5, and the error rate measurement unit 6 which form the error rate measurement device 1 (1A, 1B, or 1C) together with the NRZ signal amplifying device 2 (2A, 2B, or 2C) according to each of the above-described embodiments will be described.

The phase shifter 4 changes the phase of a reading clock relative to the data signal S1 from the NRZ signal amplifying device 2 (2A, 2B, or 2C).

Figure 5:
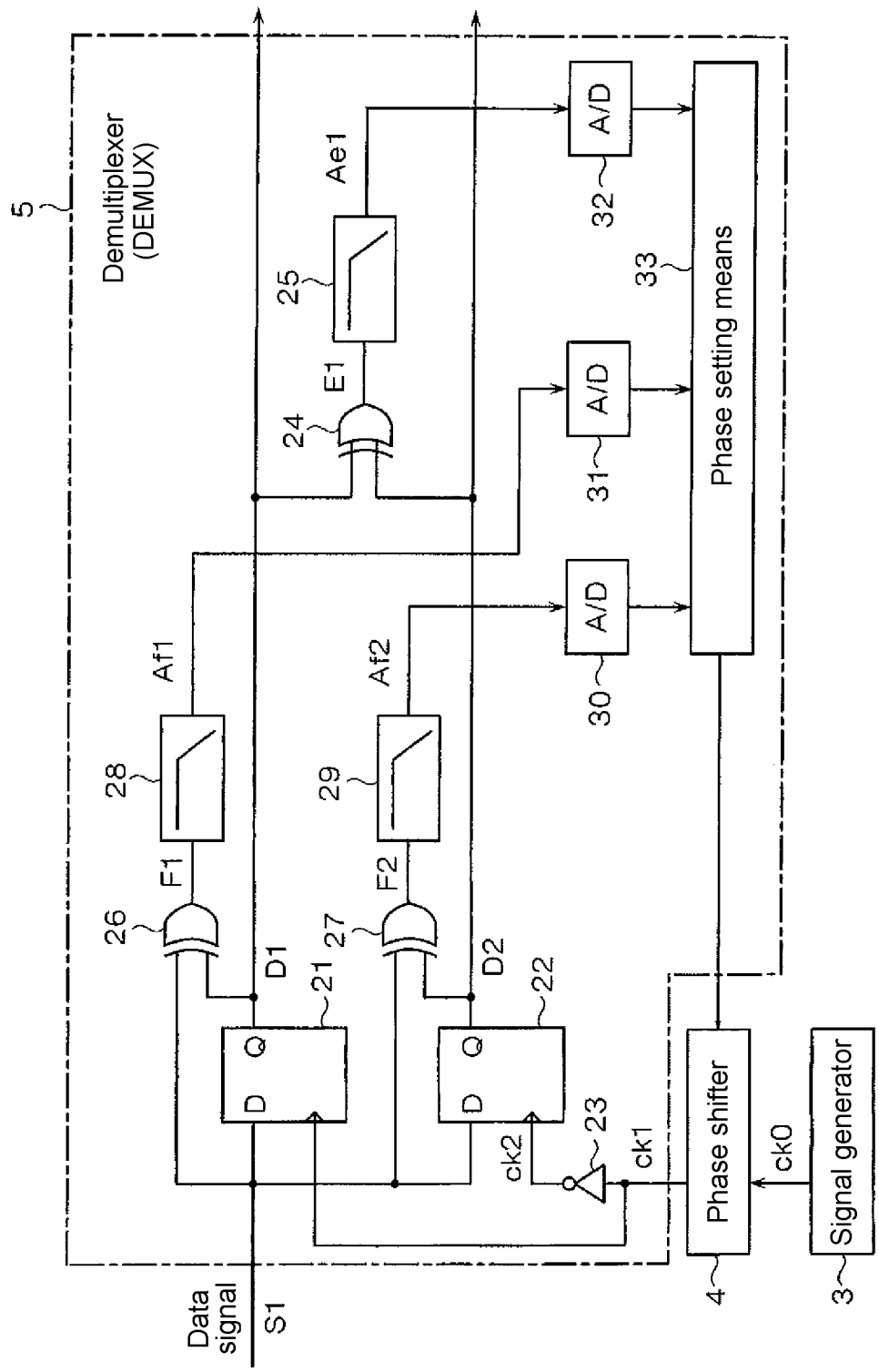
FIG. 5 is a block diagram illustrating an example of the internal structure of a demultiplexer shown in FIGS. 1 to 3.
Figure 6:
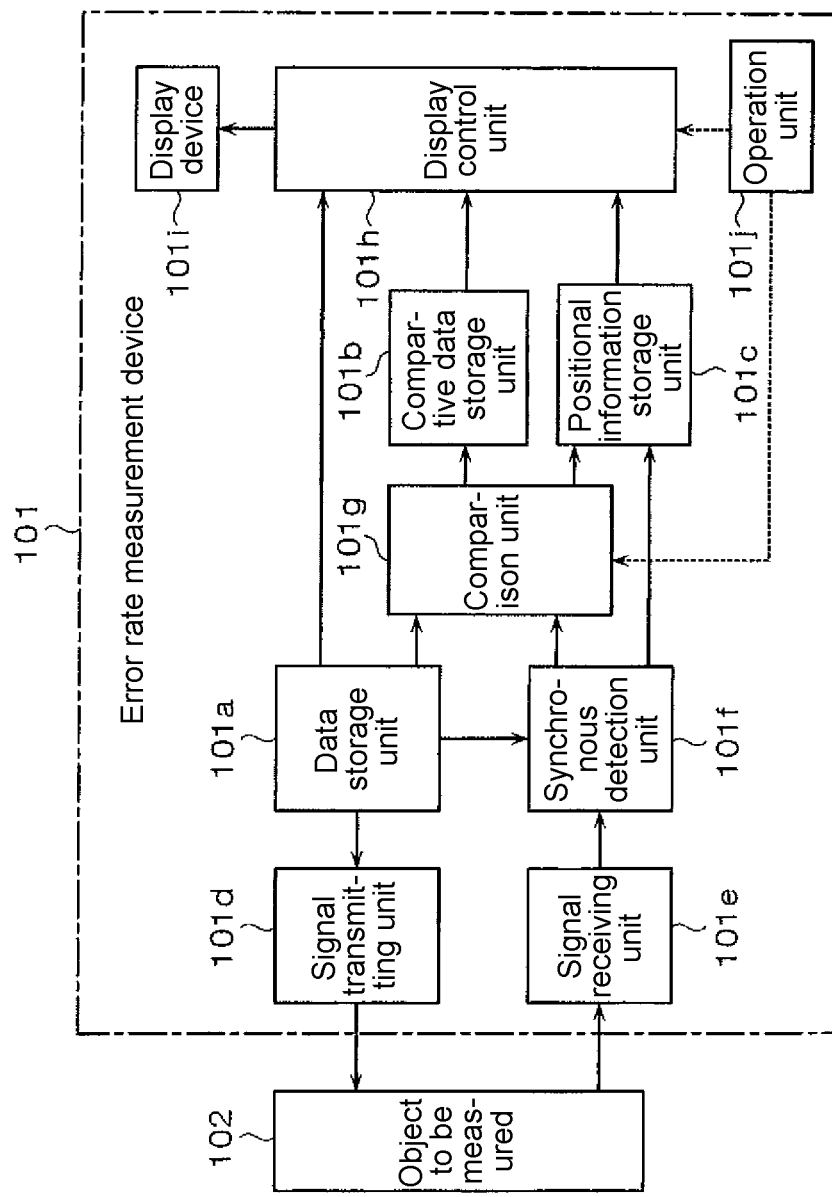
FIG. 6 is a block diagram illustrating an error rate measurement device disclosed in Patent Document 1.

As shown in FIG. 5, the demultiplexer (DEMUX) 5 includes two D-type flip-flops 21 and 22, an inverter 23, a first exclusive OR circuit 24, a first filter 25, two second exclusive OR circuits 26 and 27, two second filters 28 and 29, three A/D converters 30, 31, and 32, and phase setting means 33.

The demultiplexer 5 shown in FIG. 5 is a one-to-two demultiplexer in which the data signal S1 which is input from the NRZ signal amplifying device 2 (2A, 2B, or 2C) is commonly input to the two D-type flip-flops 21 and 22 and a reading clock which has a clock cycle that is two times the clock cycle of the data signal S1 and has a phase that is shifted in the clock cycle is input to each of the flip-flops 21 and 22.

In addition, two-phase reading clocks ck1 and ck2 which have a clock cycle that is two times the clock cycle of the data signal S1 and have a phase that is shifted in the clock cycle are input to clock terminals of the flip-flops 21 and 22.

The reading clocks ck1 and ck2 are generated by the signal generator 3. The structure of the signal generator 3 varies depending on the value of N. When N is 2, the signal generator 3 generates a reference clock ck0 with a clock cycle that is two times the clock cycle of the data signal S1 and inputs the reference clock ck0 to the phase shifter 4. The reference clock ck0 is used as the reading clock ck1 and the inverter 23 inverts the reading clock ck1 into the reading clock ck2. Since the two reading clocks ck1 and ck2 are inverted relative to each other, the phase difference between the two reading clocks ck1 and ck2 is equal to the cycle of the data signal S1.

Each of the flip-flops 21 and 22 alternately and continuously performs a process of reading the data signal S1. The read data signals D1 and D2 are input to the first exclusive OR circuit (EXOR circuit) 24. The first exclusive OR circuit 24 outputs a low level for the period for which the read data signals D1 and D2 are identical to each other and outputs a high level for the period for which the read data signals D1 and D2 are not identical to each other.

An output signal E1 from the first exclusive OR circuit 24 is input to the first filter 25, which is a low-pass filter, and a DC component (average value) Ae1 of the output signal E1 is extracted.

The flip-flops 21 and 22 are provided with a second exclusive OR circuit 26 which calculates the exclusive OR of the data signal S1 input to a data terminal D and the read data signal D1 output from an output terminal Q and a second exclusive OR circuit 27 which calculates the exclusive OR of the data signal S1 input to a data terminal D and the read data signal D2 output from an output terminal Q, respectively. Output signals F1 and F2 from the second exclusive OR circuits 26 and 27 are input to the second filters 28 and 29, which are low-pass filters, and DC components (average values) Af1 and Af2 of the output signals F1 and F2 are extracted.

The output Ae1 from the first filter 25 and the outputs Af1 and Af2 from the two second filters 28 and 29 are converted into digital values by the A/D converters 30, 31, and 32, respectively, and are then input to the phase setting means 33.

The phase setting means 33 controls the phase shifter 4 on the basis of the outputs from the filters 25, 28, and 29 and optimizes the phases of the reading clocks ck1 and ck2 relative to the data signal S1.

The output Ae1 from the first filter 25 is the average value of the exclusive OR of the read data signals D1 and D2. In a case in which a pseudo-random signal which is generally used in, for example, error measurement is input as the data signal S1, even when the phase of the reading clocks ck1 and ck2 relative to the data signal S1 is changed in a phase margin range, the relative phase of the read data signals D1 and D2 is not changed. Therefore, the output Ae1 from the first filter 24, which is the average value of the exclusive OR of the read data signals D1 and D2, is determined by the pattern of the data signal S1 and is a constant value.

However, when there is no phase margin, a bit error stochastically occurs in the read data signals D1 and D2. Therefore, the average value of the exclusive OR is greatly changed from a constant value when there is a phase margin. For this reason, the phase shifter 4 is controlled such that the output Ae1 from the first filter 25 is changed. The amount of phase shift is set to an intermediate value between two amounts of phase shift when the output Ae1 is changed. In this way, it is possible to maximize the phase margin.

That is, the amount of phase shift of the phase shifter 4 is continuously changed in the range in which the output Ae1 is reduced at two points. An intermediate value between two amounts of phase shift when the output Ae1 is reduced is calculated and is set as an optimum value to the shifter 4. Therefore, it is possible to maximize the phase margin.

Feedback control is performed for the amount of phase shift such that the output values Af1 and Af2 are an intermediate value Vc=(Va+Vb)/2 on the assumption that the pattern of the data signal S1 is the pseudo-random pattern and both the probability that the exclusive OR of bit data items which are input in a different order will be 0 (low level) and the probability that the exclusive OR of the bit data items will be 1 (high level) are 1/2 (mark ratio: 1/2) and the average value thereof is constant. In this case, it is possible to correct and control the read phase in real time in correspondence with a change in the phase of the data signal S1 (tracking mode).

In contrast, when the pattern of the data signal S1 is not the pseudo-random signal, but is a special pattern (for example, a pattern in which 0 and 1 are alternately arranged), as described above, the amount of phase shift of the phase shifter 4 is greatly changed, two amounts of phase shift at which the output Ae1 from the first filter 25 is changed are calculated, and the intermediate value between the two amounts of phase shift is set, prior to the actual data reading process (fixed mode).

That is, when the output Ae1 is in a predetermined range, the data signal S1 is determined to be a pseudo-random pattern signal with a mark ratio of 1/2 and the operation mode is changed to the tracking mode which performs feedback control for the amount of phase shift of the phase shifter 4 such that the output values Af1 and Af2 from the second filters 28 and 29 are substantially the intermediate value Vc in a linear change. Even when the phase of the data signal S1 is changed, the phase of the read clocks C1 and C2 is changed so as to follow the change in the phase by the feedback control. Therefore, it is possible to accurately read data.

When the output Ae1 is not in the predetermined range, the amount of phase shift is changed by Tc/2 and it is determined whether the output Ae1 is once again in the predetermined range. When the amount of phase shift is changed by Tc/2 and the output Ae1 is in the predetermined range, it is determined that there is no phase margin and the operation mode is changed to the tracking mode. In contrast, when the amount of phase shift is changed by Tc/2, but the output Ae1 is not in the predetermined range, it is determined that the pattern of the data signal S1 is a special pattern without randomness and it is difficult to perform control in the tracking mode. The amount of phase shift of the phase shifter 4 is changed by a very small value Δ and the output value Ae1 from the first filter 25 is stored so as to be associated with the amount of phase shift. Then, the amount of phase shift is continuously changed by 2Tc and two positions Td1 and Td2 where the output value Ae1 is changed are calculated. The amount of phase shift (Td1+Td2)/2, which is an intermediate value between the two change positions, is set as an optimum value to the phase shifter 4.

The structure of the demultiplexer 5 to which the data signal S1 is input from the main amplifier 12 of the NRZ signal amplifying device 2 has been described with reference to FIG. 5. However, the data signal S2 from the main amplifier 12 of the NRZ signal amplifying device 2 is input to a D-bar terminal of the demultiplexer 5 and the same process as that for the data signal S1 is performed for the data signal S2. In FIG. 5, the second exclusive OR circuits 26 and 27 and the second filters 28 and 29 may be omitted. In this case, after the amount of phase shift is initialized, the output value Ae1 from the first filter 25 is stored so as to be associated with the amount of phase shift of the phase shifter 4 while the amount of phase shift of the phase shifter 4 is changed by a predetermined value A. Then, the amount of phase shift is continuously changed by 2Tc and two positions Td1 and Td2 where the output value Ae1 is changed are calculated. The amount of phase shift (Td1+Td2)/2, which is an intermediate value between the two change positions, is set as an optimum value to the phase shifter 4. The detailed structure and operation of the phase shifter 4 and the demultiplexer 5 are the same as those disclosed in JP-A-2010-28662 (see paragraphs [0016] to [0055]).

The error rate measurement unit 6 compares a reference signal and the signal to be amplified (NRZ signal: S), which is output from the object to be measured and is obtained by reducing the bit rate of the data signals S1 and S2 from the NRZ signal amplifying device 2 using a plurality of demultiplexers (not shown) including the demultiplexer 5, in a bit unit, measures the error rate of the signal to be amplified, and displays the measurement result on a display unit (not shown).

As such, the NRZ signal amplifying device 2 sets the offset voltage applied to the offset circuit 11 using the existing automatic adjustment function, calculates the offset adjustment voltage on the basis of the voltage difference (A/D1−A/D2 or A/D2−A/D1) between two signals, which are output from the main amplifier 12 and are inverted relative to each other, and the point where the polarity is changed, and finely adjusts the offset voltage using the calculated offset adjustment voltage. In particular, even when the quality of the NRZ signal with a very small amplitude (for example, 10 mVp-p to 25 mVp-p) is measured for a long period of time, it is possible to set an optimum offset voltage so as to follow the input signal using the existing automatic adjustment function and to apply the offset voltage to the offset circuit 11.

Figure 7:
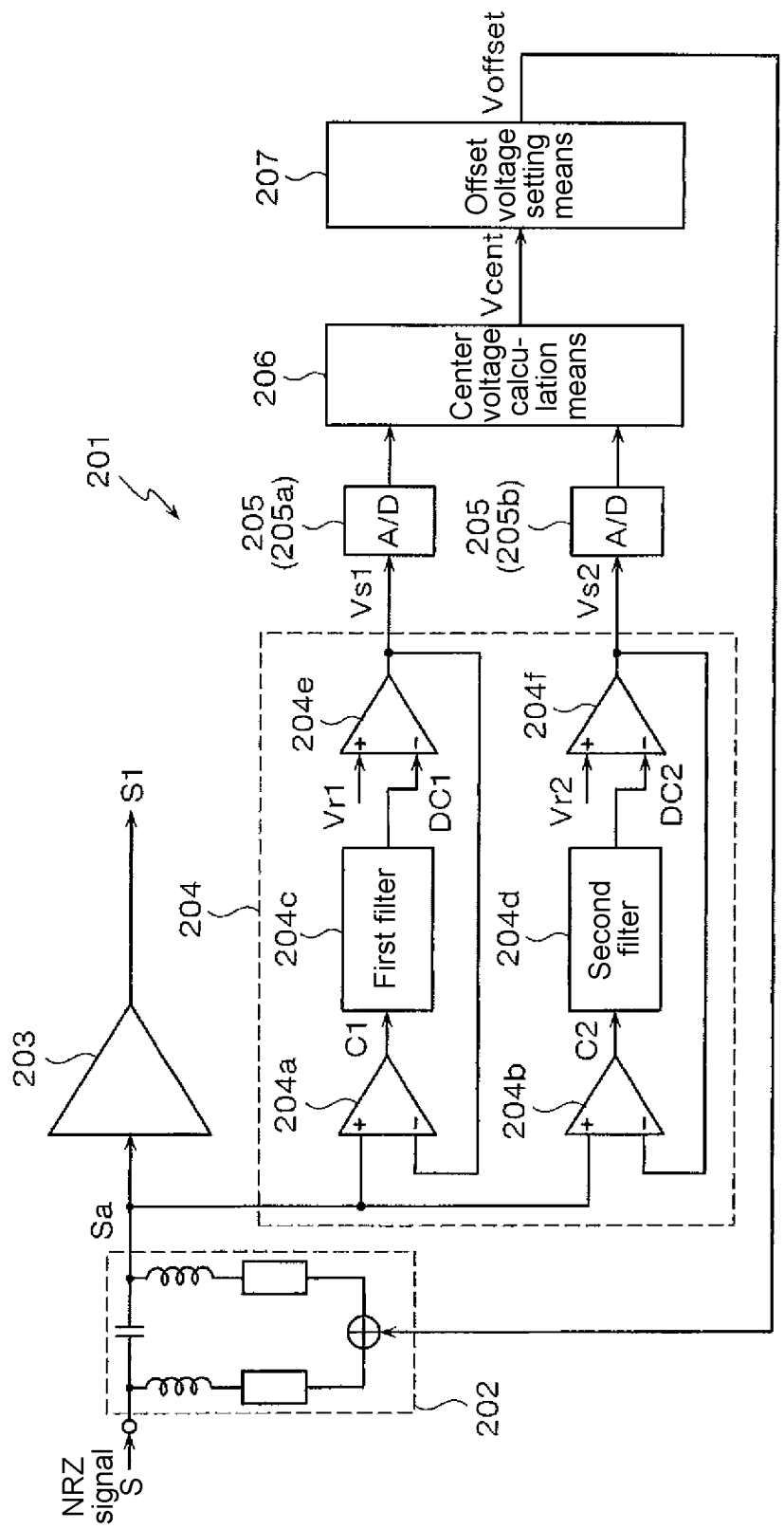
FIG. 7 is a block diagram illustrating an NRZ signal amplifying device disclosed in Patent Document 2.

Specifically, if the error when the offset voltage is set by a manual operation using a graphical user interface (GUI) is 0, the NRZ signal amplifying device 2 according to the invention can reduce the error to 1 mV or less while an error of 10 mV occurs in the NRZ signal amplifying device 201 shown in FIG. 7 which is disclosed in Patent Document 2. Therefore, it is possible to detect the NRZ signal with a very small amplitude of 10 mVp-p to 25 mVp-p, which has not been achieved by the NRZ signal amplifying device 201 disclosed in Patent Document 2. As a result, even when the NRZ signal with a very small amplitude is measured, it is possible to accurately measure the error rate of the signal.

However, for the comparison and determination of A/D1 and A/D2 by the comparison and determination means 15b according to the above-described embodiment, when the input pattern of the NRZ signal S has a mark ratio of 1/2 (the ratio of "1" and "0" patterns is the same) and there is no level difference between two outputs of the main amplifier 12, the same value is preferable as the optimum value of the offset voltage. When a weight is given to the optimum value on the basis of the input pattern (the ratio of 1 and 0) or the error of the main amplifier 12 (there is a difference between the amplitudes of A/D1 and A/D2), the offset voltage is optimized with a small amount of error for various patterns of NRZ signals. For example, when the ratio of bits "1" and "0" in the input pattern of the NRZ signal is 2:6 and A/D1=6a/8 [V] and A/D2=2a/8 [V] (a: amplitude) are optimum output values, it is preferable that the offset adjustment voltage be calculated such that A/D1−A/D2 is not 0 and A/D1−A/D2 is a/2 and the offset voltage be finely adjusted.

The preferred embodiments of the error rate measurement device including the NRZ signal amplifying device according to the invention have been described above. However, the invention is not limited to the above-described embodiments and the drawings. That is, other embodiments, examples, and operation techniques which are conceived by those skilled in the art on the basis of the above-described embodiments are all included in the scope of the invention.

DESCRIPTION OF REFERENCE NUMERALS AND SIGNS 1 (1A, 1B, 1C): ERROR RATE MEASUREMENT DEVICE
2 (2A, 2B, 2C): NRZ SIGNAL AMPLIFYING DEVICE
3: SIGNAL GENERATOR
4: PHASE SHIFTER
5: DEMULTIPLEXER (DEMUX)
6: ERROR RATE MEASUREMENT UNIT
11: OFFSET CIRCUIT
12: MAIN AMPLIFIER
13: INPUT-SIDE VOLTAGE DETECTION MEANS
14: OUTPUT-SIDE VOLTAGE DETECTION MEANS
15: OFFSET VOLTAGE CONTROL MEANS
15A: CENTER VOLTAGE CALCULATION MEANS
15B: COMPARISON AND DETERMINATION MEANS
15C: OFFSET VOLTAGE CALCULATION MEANS
15D: OFFSET VOLTAGE SETTING MEANS
15E: COMPARISON CIRCUIT
15F: SWITCHING CIRCUIT

What is claimed is:

1. An NRZ signal amplifying device comprising:
an offset circuit that applies an offset voltage to an NRZ signal which is input as a signal to be amplified and outputs the signal;
a main amplifier that receives the output signal from the offset circuit, amplifies the output signal, and outputs the amplified signal as two signals which are inverted relative to each other;
input-side voltage detection means for detecting a high-level voltage and a low-level voltage of an input signal to the main amplifier;
output-side voltage detection means for detecting the voltages of the two signals inverted relative to each other which are output from the main amplifier; and
offset voltage control means for calculating a center voltage between the high-level voltage and the low-level voltage detected by the input-side voltage detection means, calculating an offset voltage at which the calculated center voltage is the center of an appropriate input range of the main amplifier, setting the offset voltage to the offset circuit, and finely adjusting the offset voltage, such that a voltage difference between the two signals inverted relative to each other which are output from the main amplifier and are detected by the output-side voltage detection means is close to 0.

2. The NRZ signal amplifying device according to claim 1, wherein the output-side voltage detection means includes two A/D converters that convert the two signals inverted relative to each other into digital values, and
the offset voltage control means includes:
comparison and determination means for comparing the digital values from the two A/D converters, calculating a voltage difference, and determines which of voltage differences of two points where the polarity of the calculated voltage difference is changed is closer to 0;
offset voltage calculation means for calculating an offset adjustment voltage for finely adjusting the offset voltage, on the basis of the voltage difference, which is closer to 0, of the voltage differences of the two points where the polarity of the voltage difference is changed; and
offset voltage setting means for setting the offset adjustment voltage calculated by the offset voltage calculation means and finely adjusting the offset voltage.

3. An error rate measurement device comprising:
the NRZ signal amplifying device according to claim 2; and
an error rate measurement unit that compares a reference signal and a data signal output from the main amplifier bit by bit and measures an error rate of the data signal.

4. The NRZ signal amplifying device according to claim 1, wherein the offset voltage control means includes:
a comparison circuit that compares the two signals which are inverted relative to each other and outputs a voltage difference between the two signals as an offset adjustment voltage; and
a switching circuit that selectively switches a first loop for setting the offset voltage to the offset circuit and a second loop for finely adjusting the offset voltage using the offset adjustment voltage from the comparison circuit.

5. An error rate measurement device comprising:
the NRZ signal amplifying device according to claim 4; and
an error rate measurement unit that compares a reference signal and a data signal output from the main amplifier bit by bit and measures an error rate of the data signal.

6. An error rate measurement device comprising:
the NRZ signal amplifying device according to claim 1; and
an error rate measurement unit that compares a reference signal and a data signal output from the main amplifier bit by bit and measures an error rate of the data signal.

7. An NRZ signal amplifying method comprising:
a step of applying an offset voltage from an offset circuit to an NRZ signal which is input as a signal to be amplified and outputting the signal;
a step of receiving the output signal from the offset circuit, amplifying the output signal using a main amplifier, and outputting the amplified signal as two signals which are inverted relative to each other;
a step of detecting a high-level voltage and a low-level voltage of an input signal to the main amplifier;
a step of detecting the voltages of the two signals inverted relative to each other which are output from the main amplifier; and
a step of calculating a center voltage between the detected high-level voltage and low-level voltage, calculating an offset voltage at which the calculated center voltage is the center of an appropriate input range of the main amplifier, setting the offset voltage to the offset circuit, and finely adjusting the offset voltage, such that a voltage difference between the detected two signals inverted relative to each other which are output from the main amplifier is close to 0.

8. The NRZ signal amplifying method according to claim 7, further comprising:
a step of converting the two signals inverted relative to each other into digital values;
a step of comparing the digital values of the two signals, calculating a voltage difference, and determining which of voltage differences of two points where the polarity of the calculated voltage difference is changed is closer to 0;
a step of calculating an offset adjustment voltage for finely adjusting the offset voltage, on the basis of the voltage difference, which is closer to 0, of the voltage differences of the two points where the polarity of the voltage difference is changed; and a step of setting the offset adjustment voltage and finely adjusting the offset voltage.

9. An error rate measurement method using the NRZ signal amplifying method according to claim 8, comprising:
a step of comparing a reference signal and a data signal output from the main amplifier bit by bit and measuring an error rate of the data signal.

10. The NRZ signal amplifying method according to claim 7, further comprising:
a step of comparing the two signals which are inverted relative to each other and outputting a voltage difference between the two signals as an offset adjustment voltage; and
a step of selectively switching a first loop for setting the offset voltage to the offset circuit and a second loop for finely adjusting the offset voltage using the offset adjustment voltage.

11. An error rate measurement method using the NRZ signal amplifying method according to claim 10, comprising:
a step of comparing a reference signal and a data signal output from the main amplifier bit by bit and measuring an error rate of the data signal.

12. An error rate measurement method using the NRZ signal amplifying method according to claim 7, comprising:
a step of comparing a reference signal and a data signal output from the main amplifier bit by bit and measuring an error rate of the data signal.

* * * * *